United States Patent
Kim et al.

(10) Patent No.: US 7,218,556 B2
(45) Date of Patent: May 15, 2007

(54) METHOD OF WRITING TO MRAM DEVICES

(75) Inventors: Hyun-Jo Kim, Hwaseong-si (KR);
Jang-Eun Lee, Suwon-si (KR);
Se-Chung Oh, Yongin-si (KR);
Jun-Soo Bae, Hwasoeng-si (KR);
Young-Ki Ha, Suwon-si (KR);
Kyung-Tae Nam, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 250 days.

(21) Appl. No.: 11/097,495

(22) Filed: Apr. 1, 2005

(65) Prior Publication Data
US 2006/0039190 A1   Feb. 23, 2006

(30) Foreign Application Priority Data
Aug. 19, 2004   (KR) .................. 10-2004-0065609

(51) Int. Cl.
*G11C 11/00* (2006.01)
(52) U.S. Cl. .................. 365/185.58; 365/171
(58) Field of Classification Search ................ 365/158, 365/171, 173
See application file for complete search history.

(56) References Cited

U.S. PATENT DOCUMENTS 6,545,906 B1   4/2003   Savtchenko et al. ......... 365/158
6,683,806 B2   1/2004   Drewes ...................... 365/158
7,054,186 B2 * 5/2006   Iwata ......................... 365/158
7,095,646 B2 * 8/2006   Slaughter et al. .......... 365/158

FOREIGN PATENT DOCUMENTS

JP   2003-91987   3/2003

* cited by examiner

*Primary Examiner*—Vu A. Le
(74) *Attorney, Agent, or Firm*—Mills & Onello LLP

(57) ABSTRACT

A method of writing to magnetic random access memory (MRAM) devices is provided. The method includes preparing a digit line disposed on a semiconductor substrate, a bit line crossing over the digit line, and a magnetic tunnel junction (MTJ) interposed between the digit line and the bit line. The MTJ has a pinned layer, a tunneling insulating layer, and a synthetic anti-ferromagnetic (SAF) free layer which are sequentially stacked. In addition, the SAF free layer has a bottom free layer and a top free layer which are separated by an exchange spacer layer. An initial magnetization state of the MTJ is read and compared with a desired magnetization state. When the initial magnetization state is different from the desired magnetization state, a first write line pulse is applied to one of the digit line and the bit line, and a second write line pulse is applied to the other of the digit line and the bit line, thereby changing the magnetization state of the MTJ. The MTJ may be disposed at an angle equal to or greater than 0° and less than 90° to a line to which the second write line pulse is applied.

20 Claims, 8 Drawing Sheets

METHOD OF WRITING TO MRAM DEVICES

CROSS-REFERENCE TO RELATED APPLICATION

This application claims the benefit of Korean Patent Application No. 2004-0065609, filed Aug. 19, 2004, the contents of which are hereby incorporated herein by reference in their entirety.

BACKGROUND OF THE INVENTION

1. Field of the Invention

The present invention relates to a semiconductor memory device and, more particularly, to a method of writing to a magnetic random access memory device.

2. Description of the Related Art

A magnetic random access memory (MRAM) is a non volatile memory device which utilizes a magnetoresistance effect to store information. In the magnetoresistance effect, resistance of an electrically conductive material is changed based on a circumferential magnetic field. An MRAM device includes a plurality of MRAM cells composed of magnetic tunnel junctions (MTJs) on a single transistor.

The MTJ is composed of multi thin layers such that electrons may cause tunneling through a very thin insulating layer sandwiched between two ferromagnetic electrodes when an external electrical signal is applied thereto. The top electrode of the two electrodes is called a free layer and the bottom electrode is called a pinned layer.

When magnetization directions within the free layer and the pinned layer are arranged parallel to each other, a tunneling current flowing through the MTJ has its maximum value. That is, the tunneling resistance has its minimum value. In contrast, when the magnetization directions within the free layer and the pinned layer are arranged anti-parallel to each other, the tunneling current flowing through the MTJ has its minimum value. That is, the tunneling resistance has its maximum value.

The MRAM utilizes magnetization to store information while the conventional memory utilizes electric charge. That is, digital data represented as '0' and '1' are stored differently based on the low resistance state where the magnetization directions of the two electrodes are parallel to each other and the high resistance state where they are anti-parallel to each other.

An anti-ferromagnetic layer which is referred to as a pinning layer is added to the pinned layer. The pinning layer acts to fix the magnetization direction of the pinned layer. That is, the pinned layer attached to the pinning layer has a large switching field, and the magnetization direction of the pinned layer is fixed always in the constant direction when an applied magnetic field is smaller than the switching field. Thus, data of the MRAM cell may be determined based on the magnetization direction within the free layer. The magnetization direction of the free layer may be changed by applying a magnetic field to its circumference or perimeter. In order to change the magnetization direction of the free layer to a desired direction, conductive layers such as a bit line and a digit line are formed to be orthogonal to each other above and below the MTJ. Current flows through each conductive layer, so that a magnetic field is generated therefrom to be used for changing the magnetization direction.

In this case, when the magnetization direction of the MTJ selected to store data is changed, a magnetization direction of the MTJ that is not selected should not be changed. However, in order to enhance the integration density within a limited space, not only the size of the MTJ but also the spacing between the MTJs should be decreased. Due to the decreased spacing between the MTJs, the magnetic field that has been generated to change the magnetization direction of the selected MTJ increasingly affects adjacent MTJs that were not selected. When this effect becomes severe enough to invert the magnetization direction of the adjacent MTJs, there cannot be a normal data storage operation.

To cope with the above-mentioned problems, another writing method referred to as toggle switching has been proposed. A writing method for an MRAM device employing the toggle switching is disclosed in U.S. Pat. No. 6,545,906 B1 entitled "Method of writing to scalable magnetoresistance random access memory element" to Savtchenko et al.

According to U.S. Pat. No. 6,545,906 B1, a digit line is positioned on a predetermined region of a semiconductor substrate. A word line is positioned above the digit line and crosses the digit line. In this case, the word line is substantially the same as a bit line. An MTJ is interposed at an interconnection between the digit line and the bit line in a tilted direction of 45° from the intersection. The MTJ includes a second magnetic region, a tunneling barrier, and a first magnetic region which are sequentially stacked. Each of the first and second magnetic regions has a synthetic anti-ferromagnetic (SAF) structure. The SAF structure is composed of a top ferromagnetic layer, a bottom ferromagnetic layer, and an anti-ferromagnetic coupling spacer layer interposed therebetween.

FIG. 1 shows a switching characteristic of an MRAM cell fabricated in accordance with U.S. Pat. No. 6,545,906 B1.

Referring to FIG. 1, the horizontal axis indicates a magnetic field ($H_W$) induced to the word line, in units of oersteds (Oe), which is the unit of magnetoresistance and is proportional to the magnitude of the word line current. The longitudinal axis indicates a magnetic field ($H_D$) induced to the digit line, also in units of oersteds (Oe) which is proportional to the magnitude of the digit line current.

There are three regions in the switching characteristic diagram, i.e., a no switching region 2, a direct switching region 5, and a toggle switching region 7. The toggle switching region 7 has a large switching area as shown in FIG. 1.

FIG. 2 shows a current waveform applied when writing operations of MRAM devices fabricated in accordance with U.S. Pat. No. 6,545,906 B1 are performed.

Referring to FIG. 2, the horizontal axis in the current waveform view denotes a lapse of time. The waveform of FIG. 2 indicates that a word line positive current pulse $I_W$ is applied to the word line 11 during the time from $t_1$ to $t_3$ and a digit line positive current pulse $I_D$ is applied to the digit line 12 during the time from $t_2$ to $t_4$ while the writing operations are performed during the time from $t_0$ to $t_4$.

The writing method utilizing the toggle switching region 7 begins with reading of an initial state of the MTJ. For example, in the case that the initial state of the MTJ is read as '1', when the word line positive current pulse $I_W$ is applied to the word line 11 during the time from $t_1$ to $t_3$ and the digit line positive current pulse $I_D$ is applied to the digit line 12 during the time from $t_2$ to $t_4$, the magnetization direction of the MTJ is changed to write a '0' state. Subsequently, when the word line positive current pulse $I_W$ is applied again to the word line 11 during the time from $t_1$ to $t_3$ and the digit line positive current pulse $I_D$ is applied again to the digit line 12 during the time from $t_2$ to $t_4$, the magnetization direction of the MTJ is changed again to write a '1' state. In this case, the word line positive current pulse $I_W$ and the digit line positive current pulse $I_D$ are applied with a time delay as shown in the figure, however these pluses constitute a sequence which has an overlapped region therebetween. In addition, the magnitude of the current pulse corresponds to the toggle switching region 7.

FIG. 3 is a partial plan view illustrating a portion of an MRAM device and a method of the prior art employing toggle switching.

Referring to FIG. 3, according to the MRAM device using toggle switching, digit lines DL are disposed on a predetermined region of a semiconductor substrate, and word lines WL crossing the digit lines DL are disposed on the digit lines DL. MTJs 16 are interposed at intersections between the digit lines DL and the word lines WL in a tilted direction of 45°. Each of the MTJs has a bottom electrode 14.

In general, the MTJ 16 has a magnetization easy axis and a magnetization hard axis. The magnetization easy axis is formed in a direction having a geometric maximum length of the MTJ 16, and the magnetization hard axis is formed in a direction orthogonal to the magnetization easy axis. Accordingly, by making the geometric shape of the MTJ 16 elliptical or rectangular or performing annealing with a magnetic field being applied, the direction of the magnetization easy axis is adjusted.

To use toggle switching, the magnetization easy axis of the MTJ 16 should be disposed in a tilted direction to be oriented at an angle of about 45° to the digit line DL or the word line WL. In this case, the digit line DL and the word line WL should be orthogonal to each other, and the MTJ 16 should be disposed at the intersection therebetween to be oriented at an angle of about 45°. As a result, it is difficult to dispose a plurality of MTJs 16 in a limited area. That is, it is not efficient to implement the MRAM device in this configuration with a high integration density.

SUMMARY OF THE INVENTION

Embodiments of the invention provide a configuration of MRAM devices and a method of writing to MRAM devices in which an allowable angle of disposing the MTJ is freely adjustable.

In one aspect, the invention is directed to a method of writing to MRAM devices. The method includes preparing a digit line disposed on a semiconductor substrate, a bit line crossing over the digit line, and an MTJ interposed between the digit line and the bit line. The MTJ has a pinned layer, a tunneling insulating layer, and an SAF free layer which are sequentially stacked. In addition, the SAF free layer has a bottom free layer and a top free layer which are separated by an exchange spacer layer. A first write line pulse is applied to one of the digit line and the bit line, and a second write line pulse is applied to the other of the digit line and the bit line, thereby changing the magnetization state of the MTJ. A first positive current pulse of the first write line pulse is turned on at a time $t_2$ and then turned off at a time $t_5$, and a second positive current pulse of second write line pulse is turned on at a time $t_1$ and then turned off at a time $t_3$, and a negative current pulse is turned on at a time $t_4$ and then turned off at a time $t_6$.

In one embodiment, the time when the first and second write line pulses are turned on and turned off may have a relationship of $t_1<t_2<t_3\leq t_4<t_5<t_6$, and the time $t_3$ may be equal to the time $t_4$.

Before the first write line pulse and the second write line pulse are applied, the method may further include reading an initial magnetization state of the MTJ and comparing the initial magnetization state with a desired magnetization state. When the initial magnetization state matches the desired magnetization state, the first and second write line pulses may not be applied. On the contrary, when the initial magnetization state does not match the desired magnetization state, the first and second write line pulses may be applied to change the magnetization state of the MTJ.

At the time of $t_6$, the magnetization state of the MTJ may be changed to be opposite to the initial magnetization state.

The digit line and the bit line may be disposed to be orthogonal to each other. The first write line pulse may be applied to the digit line and the second write line pulse may be applied to the bit line. Alternatively, the first write line pulse may be applied to the bit line and the second write line pulse may be applied to the digit line.

In addition, the MTJ may be disposed at an angle equal to or greater than 0° and less than 90° to a line to which the second write line pulse is applied. For example, when the line to which the first write line pulse is applied is the digit line and the line to which the second write line pulse is applied is the bit line, the MTJ may be disposed parallel to the bit line or at an angle greater than 0° and less than 90° to the bit line. In one embodiment, the MTJ is disposed at an angle parallel to the digit line. In one embodiment, the MTJ is disposed at an angle parallel to the bit line.

The pinned layer, the bottom free layer, and the top free layer may be ferromagnetic layers. The ferromagnetic layers may be formed of a material selected from a group consisting of Co, Fe, and Ni, or an alloy composed of at least two materials thereof.

In one embodiment, the exchange spacer layer may be formed of a material selected from a group consisting of Ru, Rh, Ir, Cr, Cu, and Re.

In another aspect, the invention is directed to another method of writing to MRAM devices. The method includes preparing a digit line disposed on a semiconductor substrate, a bit line crossing over the digit line, and an MTJ interposed between the digit line and the bit line. The MTJ has a pinned layer, a tunneling insulating layer, and an SAF free layer which are sequentially stacked. In addition, the SAF free layer has a bottom free layer and a top free layer which are separated by an exchange spacer layer. An initial magnetization state of the MTJ is read and compared with a desired magnetization state. If the initial magnetization state is different from the desired magnetization state, a first write line pulse is applied to one of the digit line and the bit line, and a second write line pulse is applied to the other the digit line and the bit line, thereby changing the magnetization state of the MTJ. A first positive current pulse of the first write line pulse is turned on at a time $t_2$ and then turned off at a time $t_5$, and a second positive current pulse of the second write line pulse is turned on at a time $t_1$ and then turned off at a time $t_3$, and a negative current pulse is turned on at a time $t_4$ and then turned off at a time $t_6$.

In one embodiment, the time when the first and second write line pulses are turned on and turned off may have a relationship of $t_1<t_2<t_3\leq t_4<t_5<t_6$, and the time $t_3$ may be equal to the time $t_4$.

In addition, the MTJ may be disposed at an angle equal to or greater than 0° and less than 90° to a line to which the second write line pulse is applied. For example, when the line to which the first write line pulse is applied is the digit line and the line to which the second write line pulse is applied is the bit line, the MTJ may be disposed parallel to the bit line or at an angle greater than 0° and less than 90° to the bit line. In one embodiment, the MTJ is disposed at an angle parallel to the digit line. In one embodiment, the MTJ is disposed at an angle parallel to the bit line.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity. In addition, when a layer is described as being on another layer or on a substrate, the layer may be formed directly on the other layer or the substrate, or a third layer may be interposed between the layer and the other layer or the substrate.

DETAILED DESCRIPTION OF THE INVENTION

Figure 1:
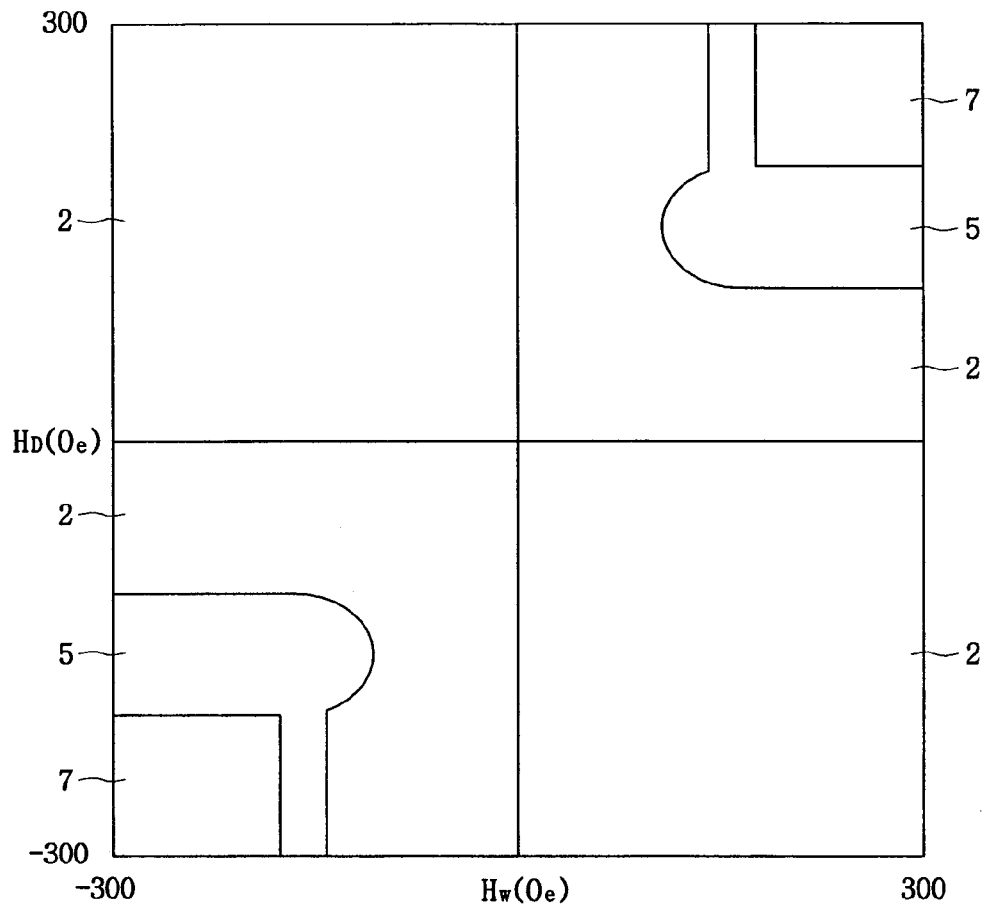
FIG. 1 is switching characteristic view of MRAM devices in accordance with the prior art.
Figure 2:
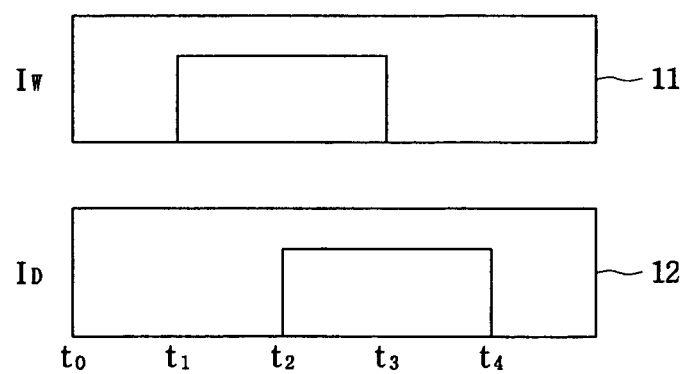
FIG. 2 shows a current waveform applied when writing operations of MRAM devices according to embodiments of the prior art are carried out.
Figure 3:
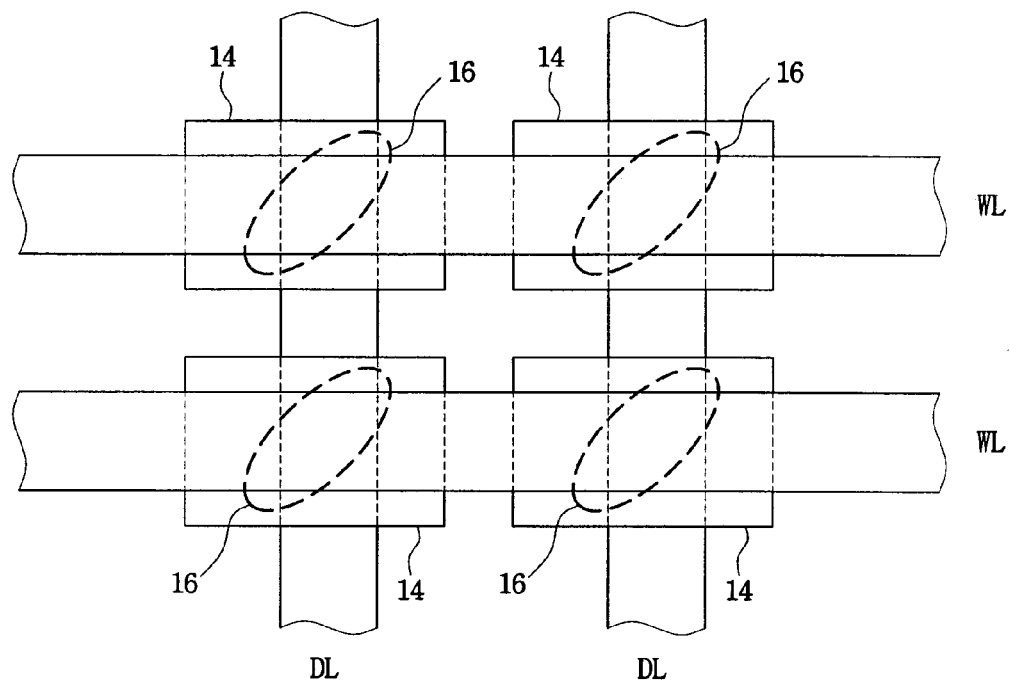
FIG. 3 is a partial plan view illustrating a portion of an MRAM device illustrating a drawback of the prior art.
Figure 4:
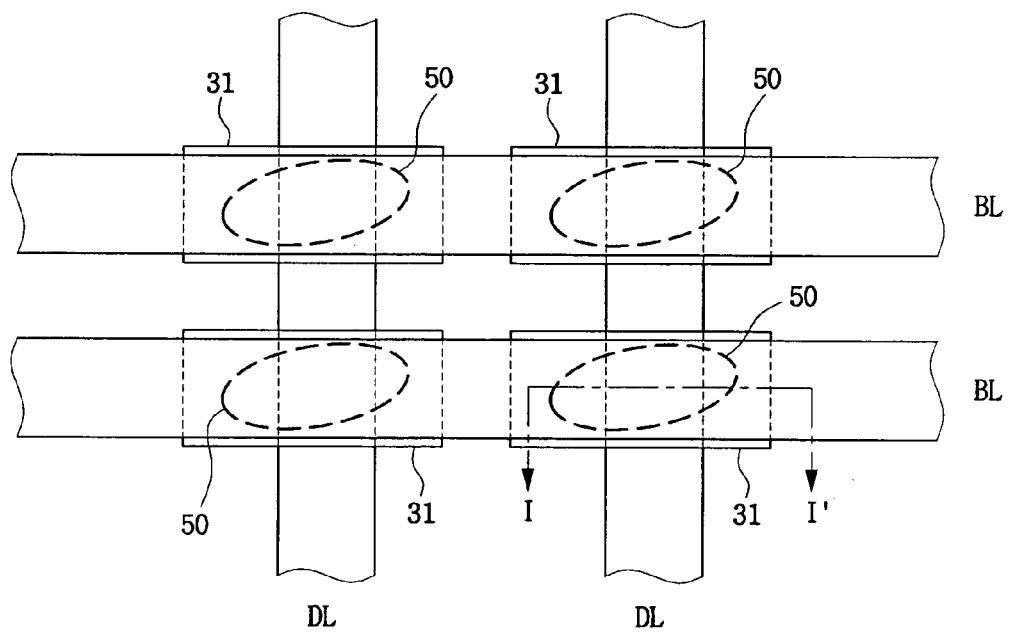
FIG. 4 is a plan view illustrating MRAM devices in accordance with embodiments of the present invention.
Figure 5:
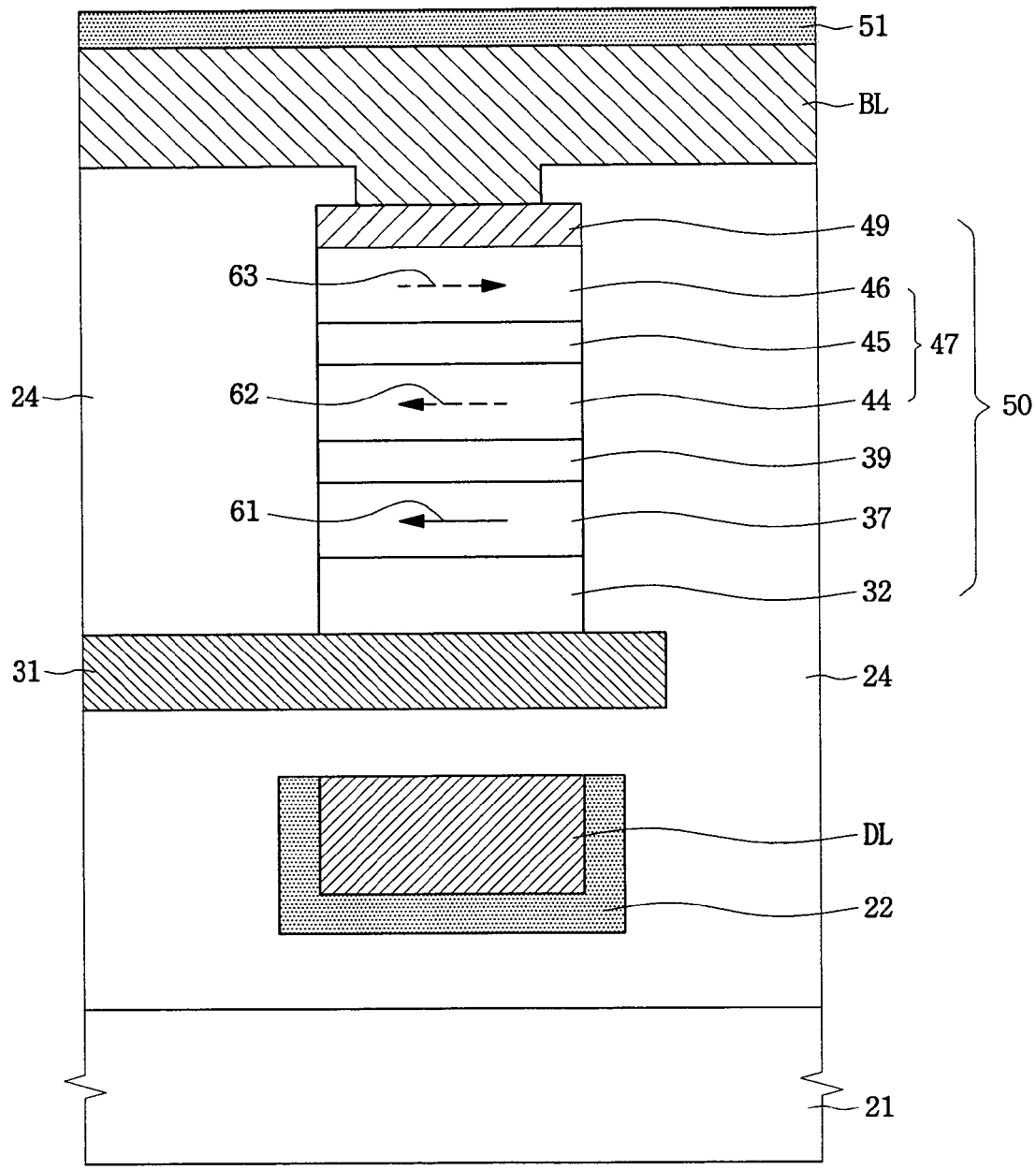
FIG. 5 is a cross-sectional view taken along the line I–I' of FIG. 4.

FIG. 4 is a plan view illustrating an MRAM device in accordance with embodiments of the present invention, and FIG. 5 is a cross-sectional view taken along line I–I' of FIG. 4.

Referring to FIGS. 4 and 5, digit lines DL are disposed in predetermined regions of a semiconductor substrate 21 including lower circuits (not shown). Bottom surfaces and sidewalls of the digit lines DL may be surrounded by first cladding patterns 22. The digit lines DL may be conductive layers such as copper layers or aluminum layers. The first cladding pattern 22 is preferably a ferromagnetic layer such as Co, CoFe, or NiFe. The first cladding pattern 22 acts to focus a magnetic flux generated by currents flowing through the digit lines DL.

Bottom electrodes 31 are disposed above the digit lines DL. The bottom electrodes 31 are insulated from the digit lines DL. That is, an interlayer dielectrics 24 is interposed between the bottom electrodes 31 and the digit lines DL. The bottom electrodes 31 are electrically connected to a lower circuit through a contact plug (not shown) penetrating the interlayer dielectrics 24.

Bit lines BL are disposed above the digit lines DL and bottom electrodes 31 in a direction crossing the digit lines DL. Top surfaces and sidewalls of the bit lines BL are surrounded by second cladding patterns 51. The bit lines BL may be conductive layers such as copper layers or aluminum layers. The second cladding pattern 51 is preferably a ferromagnetic layer such as Co, CoFe, or NiFe. The second cladding pattern 51 acts to focus magnetic flux generated by currents flowing through the bit lines BL. The bit lines BL and the digit lines DL may be disposed to be orthogonal to each other.

One MTJ 50 is disposed at each intersection between the bit lines BL and the digit lines DL. The MTJ 50 has a stacked structure of a pinning layer 32, a pinned layer 37, a tunneling insulating layer 39, an SAF free layer 47, and a top electrode 49 which are sequentially stacked. The top electrode 49 of the MTJ 50 may be connected to the bit line BL, and the pinning layer 32 which is the lowest layer of the MTJ 50 may be connected on the bottom electrode 31. That is, the bottom electrode 31 and the bit line BL may be configured to be electrically connected to each other through the MTJ 50.

The pinning layer 32 is an anti-ferromagnetic layer, and the pinned layer 37 is a ferromagnetic layer. The pinning layer 32 serves to fix a magnetization direction 61 of the pinned layer 37. That is, the pinned layer 37 attached to the pinning layer 32 has a large switching field, and the magnetization direction 61 of the pinned layer 37 is fixed always in a constant direction when an applied magnetic field is smaller than the switching field. The pinned layer 37 may have a structure composed of one ferromagnetic layer, or an SAF structure composed of three layers. The SAF structure includes a bottom pinned layer and a top pinned layer which are separated by an exchange spacer layer. Each of the bottom pinned layer and the top pinned layer is formed of a ferromagnetic layer. The exchange spacer layer may be a Ru layer. The SAF structure has a characteristic that the magnetization directions of the bottom and top pinned layers are arranged to be anti-parallel to each other because of the effect of the exchange spacer layer. That is, when an initial magnetization direction is applied to the bottom pinned layer attached to the pinning layer 32, the magnetization direction of the top pinned layer is arranged in an anti-parallel state to be fixed.

The tunneling insulating layer 39 may be an insulating layer such as an aluminum oxide layer. A read current for the MRAM device flows through the tunneling insulating layer 39. The amount of the read current flowing through the tunneling insulating layer 39 has a high correlation with the thickness of the tunneling insulating layer 39. Thus, the tunneling insulating layer 39 preferably has a uniform thickness.

The SAF free layer 47 includes a bottom free layer 44 and a top free layer 46 which are separated by an exchange spacer layer 45. Each of the bottom free layer 44 and the top free layer 46 is composed of a ferromagnetic layer. The exchange spacer layer 45 may be formed of a material selected from a group consisting of Ru, Rh, Ir, Cr, Cu, and Re. The SAF free layer 47 has a characteristic that the magnetization directions 62 and 63 of the bottom and top free layers 44 and 46 are arranged to be anti-parallel to each other due to the effect of the exchange spacer layer 45. In addition, the magnetization directions 62 and 63 of the SAF free layer 47 may be changed by the magnetic fields generated in the digit line DL and the bit line BL.

The ferromagnetic layers 37, 44, and 46 may be formed of a material selected from a group consisting of Co, Fe, and Ni, or may be formed of an alloy containing at least two materials selected from the group.

The MTJ 50 has a magnetization easy axis and a magnetization hard axis. The magnetization easy axis is formed in a direction of a geometric maximum length of the MTJ 50, and the magnetization hard axis is formed in a direction orthogonal to the magnetization easy axis. Accordingly, in order to dispose the magnetization easy axis of the MTJ 50 in a desired direction, the MTJ 50 may be configured to have an elliptic shape, a rectangular shape, a U-shape, a crisscross shape, or a shield shape when seen from its plan view. The magnetization directions 61, 62, and 63 inside of the MTJ 50 are characterized in that they are self-aligned parallel or anti-parallel to the magnetization easy axis in a state when an external magnetic field is not applied thereto.

When the MRAM cell operates in a writing mode, a writing current flows through the bit line BL and the digit line DL to magnetize the SAF free layer 47. To detail this, the magnetization directions 62 and 63 forced within the SAF free layer 47 during the writing operation are determined by the direction of the writing current flowing through the bit line BL and the digit line DL, and may be parallel or anti-parallel to the magnetization direction 61 maintained within the pinned layer 37. However, because of the effect of the exchange spacer layer 45, the SAF free layer 47 has a characteristic that the magnetization directions 62 and 63 within the bottom free layer 44 and the top free layer 46 are aligned anti-parallel to each other. When the magnetization directions 62 and 63 within the bottom free layer 44 and the top free layer 46 are aligned anti-parallel to each other and the magnetization direction 62 within the bottom free layer 44 is arranged in a direction parallel to the magnetization direction 61 maintained within the pinned layer 37, the MTJ 50 will show a decreased magnetic resistance value. On the contrary, when the magnetization directions 62 and 63 within the bottom free layer 44 and the top free layer 46 are aligned anti-parallel to each other and the magnetization direction 62 within the bottom free layer 44 is arranged in an anti-parallel direction to the magnetization direction 61 maintained within the pinned layer 37, the MTJ 50 will show an increased magnetic resistance value.

Figure 6:
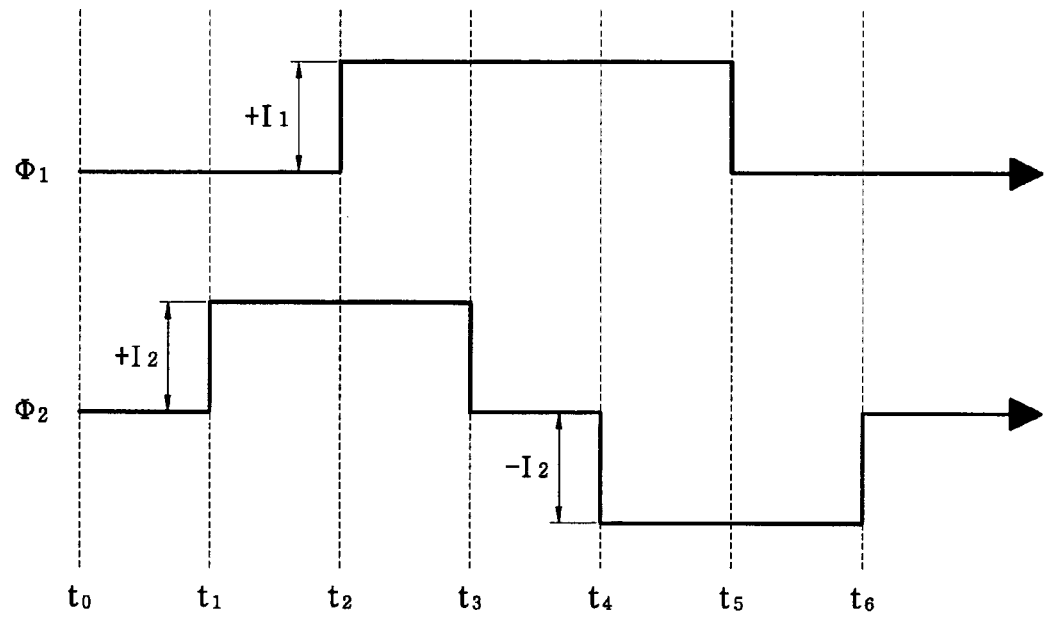
FIG. 6 shows a current waveform applied when writing operations of MRAM devices according to embodiments of the present invention are carried out.
Figure 7:
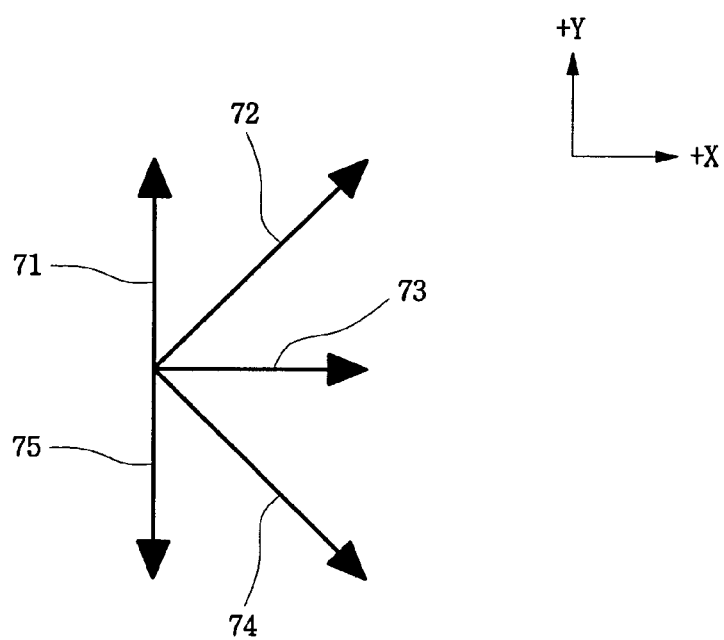
FIG. 7 is a response characteristic view showing directions of synthetic magnetic fields per respective current waveforms applied based on the current waveform view of FIG. 6.

FIG. 6 shows current waveforms applied when writing operations of MRAM devices according to embodiments of the present invention are carried out, and FIG. 7 is a response characteristic view showing directions of synthetic magnetic fields per respective current waveforms applied as shown in FIG. 6.

Referring to FIGS. 6 and 7, a toggle switching method is used for the writing operation of the MRAM device in accordance with embodiments of the present invention. The toggle switching method include applying a first write line pulse $\Phi 1$ to one of the bit line BL and the digit line DL, and a second write line pulse $\Phi 2$ to the other of the bit line BL and the digit line DL. When the selected one is the bit line BL, the other one may be the digit line DL which crosses the bit line BL, and when the selected one is the digit line DL, the other one may be the bit line BL which crosses the digit line DL. A horizontal axis of the current waveform diagram shows the passage of time. That is, the first write line pulse $\Phi 1$ and the second write line pulse $\Phi 2$ are applied to the selected lines during a time from $t_0$ to $t_6$, respectively. The time from $t_0$ to $t_6$ has a relationship of $t_0 < t_1 < t_2 < t_3 \leq t_4 < t_5 < t_6$. In this case, time $t_3$ may be equal to the time $t_4$. As shown in the figure, a first positive current pulse +I1 of the first write line pulse $\Phi 1$ is turned on at the time $t_2$ and then turned off at the time $t_5$, and a second positive current pulse +I2 of the second write line pulse $\Phi 2$ is turned on at the time $t_1$ and then turned off at the time $t_3$, and a second negative current pulse −I2 of the second write line pulse $\Phi 2$ is turned on at the time $t_4$ and then turned off at the time $t_6$. In this case, when the time $t_3$ is equal to the time $t_4$, the second positive current pulse +I2 is turned off at the time $t_3$ while the second negative current pulse −I2 is concurrently turned on at the time $t_4$ in the second write line pulse $\Phi 2$. The negative current pulse means a reverse current pulse.

When the first write line pulse $\Phi 1$ and the second write line pulse $\Phi 2$ are applied to the selected lines respectively, stepwise directions of synthetic magnetic fields 71, 72, 73, 74, and 75 applied to the MTJ 50 disposed at an intersection of the selected lines are shown in FIG. 7. At the time $t_1$, the first write line pulse $\Phi 1$ is turned off and the second positive current pulse +I2 of the second write line pulse $\Phi 2$ is turned on so that the first synthetic magnetic field 71 is formed in a +Y direction. At the time $t_2$, the first positive current pulse +I1 of the first write line pulse $\Phi 1$ is turned on to generate a magnetic field, which is synthesized with the magnetic field generated by the second write line pulse $\Phi 2$ which is already turned on, so that the second synthetic magnetic field 72 is formed to be rotated by an angle of 45° clockwise from the +Y direction. That is, the second synthetic magnetic field 72 is centered between the +Y direction and the +X direction. At the time $t_3$, the first write line pulse $\Phi 1$ is turned on and the second write line pulse $\Phi 2$ is turned off so that the third synthetic magnetic field 73 is formed in a +X direction. At the time $t_4$, the first write line pulse $\Phi 1$ is already turned on and the second negative current pulse −I2 of the second write line pulse $\Phi 2$ is turned on, so that the fourth synthetic magnetic field 74 is formed to be rotated by an angle of 45° clockwise from the +X direction. That is, the fourth synthetic magnetic field 74 is centered between the +X direction and the −Y direction. At the time $t_5$, the first write line pulse $\Phi 1$ is turned off and the second negative current pulse −I2 of the second write line pulse $\Phi 2$ is already turned on so that the fifth synthetic magnetic field 75 is formed in the −Y direction. That is, the first synthetic magnetic field 71 is formed in a direction opposite to that of the fifth synthetic magnetic field 75. At the time $t_6$, both of the first write line pulse $\Phi 1$ and the second write line pulse $\Phi 2$ are turned off.

FIGS. 8 to 11 are response characteristic views showing magnetization directions of SAF free layers based on stepwise current waveforms when writing operations of MRAM devices according to embodiments of the present invention are carried out.

Figure 8:
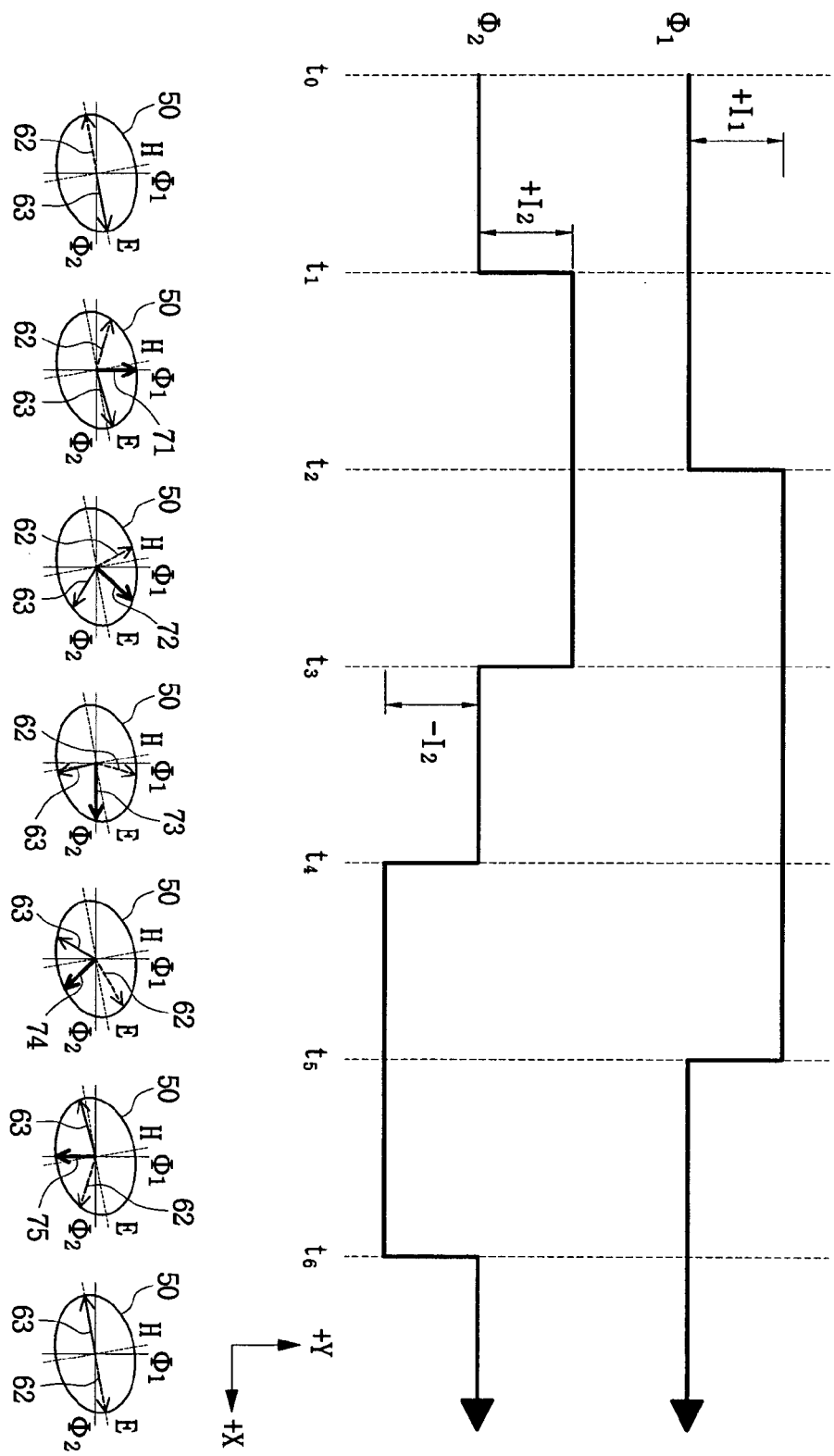
FIGS. 8 to 11 are response characteristic views showing the process of changing magnetization directions when writing operations of MRAM devices according to embodiments of the present invention are carried out.

Referring to FIG. 8, the process of changing the magnetization direction of the MTJ 50 which employs the toggle switching method according to the embodiments of the present invention will be described. It is assumed that the geometric shape of the MTJ 50 is formed to be elliptic when seen from its plan view, and the magnetization easy axis E formed in the MTJ 50 is disposed to have an intersection angle of 10° to the line to which the second write line pulse $\Phi 2$ is applied.

Referring to FIG. 8, a writing method using the toggle switching method starts with reading an initial state of the MTJ 50. The read result of the initial state will be one between a state indicating a low resistance of the MTJ 50 and a state indicating a high resistance of the same. For example, when it is read that the MTJ 50 is in the low resistance state, data to be written in the MTJ 50 do not need to be subjected to the process of changing the magnetization direction so that they remain the same. On the contrary, when it is read that the MTJ 50 is in the high resistance state, the data to be written in the MTJ 50 are subjected to the process of changing the magnetization direction.

At the time $t_0$, when it is read that the MTJ 50 is in the low resistance state, the magnetization directions 62 and 63 within the bottom free layer 44 and the top free layer 46 are aligned anti-parallel to each other, and the magnetization direction 62 within the bottom free layer 44 is aligned parallel to the magnetization direction 61 which is kept within the pinned layer 37. In addition, the magnetization directions 62 and 63 within the bottom free layer 44 and the top free layer 46 are aligned anti-parallel to each other along the magnetization easy axis E of the MTJ 50.

At the time $t_1$, the first write line pulse Φ1 is turned off and the second positive current pulse +I2 of the second write line pulse Φ2 is turned on so that the first synthetic magnetic field 71 is formed in a +Y direction. Because of the effect of the first synthetic magnetic field 71, the magnetization direction 62 within the bottom free layer 44 is rotated in a clockwise direction and the magnetization direction 63 within the top free layer 46 is rotated in a counterclockwise direction. However, the magnetization directions 62 and 63 within the bottom free layer 44 and the top free layer 46 are characterized in that they are aligned anti-parallel to each other, so that they are not fully rotated in the +Y direction. As a result, the magnetization directions 62 and 63 within the bottom free layer 44 and the top free layer 46 are rotated a little from both sides of the first synthetic magnetic field 71 toward the +Y direction.

At the time $t_2$, the first positive current pulse +I1 of the first write line pulse Φ1 is turned on to generate a magnetic field, which is synthesized with the magnetic field generated by the second write line pulse Φ2 which is already turned on, so that the second synthetic magnetic field 72 is formed to be rotated by an angle of 45° clockwise from the +Y direction. That is, the second synthetic magnetic field 72 is centered between the +Y direction and the +X direction. Because of the effect of the second synthetic magnetic field 72, the magnetization direction 62 within the bottom free layer 44 is further rotated clockwise to be positioned near the +Y direction, and the magnetization direction 63 within the top free layer 46 is further rotated clockwise to be positioned below the +X direction.

At the time $t_3$, the first write line pulse Φ1 is already turned on and the second write line pulse Φ2 is turned off so that the third synthetic magnetic field 73 is formed in a +X direction. Because of the third synthetic magnetic field 73, the magnetization direction 62 within the bottom free layer 44 is further rotated in a clockwise direction to pass the magnetization hard axis H of the MTJ 50 so that it is positioned near the +Y direction, and the magnetization direction 63 within the top free layer 46 is further rotated in a clockwise direction to be positioned near the −Y direction.

At the time $t_4$, the first write line pulse Φ1 is already turned on and the second negative current pulse −I2 of the second write line pulse Φ2 is turned on, so that the fourth synthetic magnetic field 74 is formed to be rotated by an angle of 45° clockwise from the +X direction. That is, the fourth synthetic magnetic field 74 is centered between the +X direction and the −Y direction. Because of the effect of the fourth synthetic magnetic field 74, the magnetization direction 62 within the bottom free layer 44 is further rotated clockwise to be positioned near the +X direction, and the magnetization direction 63 within the top free layer 46 is further rotated clockwise so that it passes the magnetization hard axis H of the MTJ 50 to be positioned near the −Y direction.

At the time $t_5$, the first write line pulse Φ1 is turned off and the second negative current pulse −I2 of the second write line pulse Φ2 is already turned on, so that the fifth synthetic magnetic field 75 is formed in the −Y direction. That is, the first synthetic magnetic field 71 is formed in a direction opposite to that of the fifth synthetic magnetic field 75. Because of the effect of the fifth synthetic magnetic field 75, the magnetization direction 62 within the bottom free layer 44 is further rotated clockwise to be positioned below the +X direction, and the magnetization direction 63 within the top free layer 46 is further rotated clockwise to be positioned near the magnetization easy axis E of the MTJ 50.

At the time $t_6$, the first write line pulse Φ1 and the second write line pulse Φ2 are turned off. The magnetization directions 62 and 63 within the bottom free layer 44 and the top free layer 46 are characterized in that they are aligned along the magnetization easy axis E of the MTJ 50, so that the magnetization directions 62 and 63 are formed to be rotated by 180° as compared to their initial states. That is, the magnetization direction 62 within the bottom free layer 44 is aligned anti-parallel to the magnetization direction 61 which is kept within the pinned layer 37, and the magnetization directions 62 and 63 within the bottom free layer 44 and the top free layer 46 are aligned anti-parallel to each other.

As a result, the MTJ 50 has a high resistance state changed from the initial low resistance state.

Figure 9:
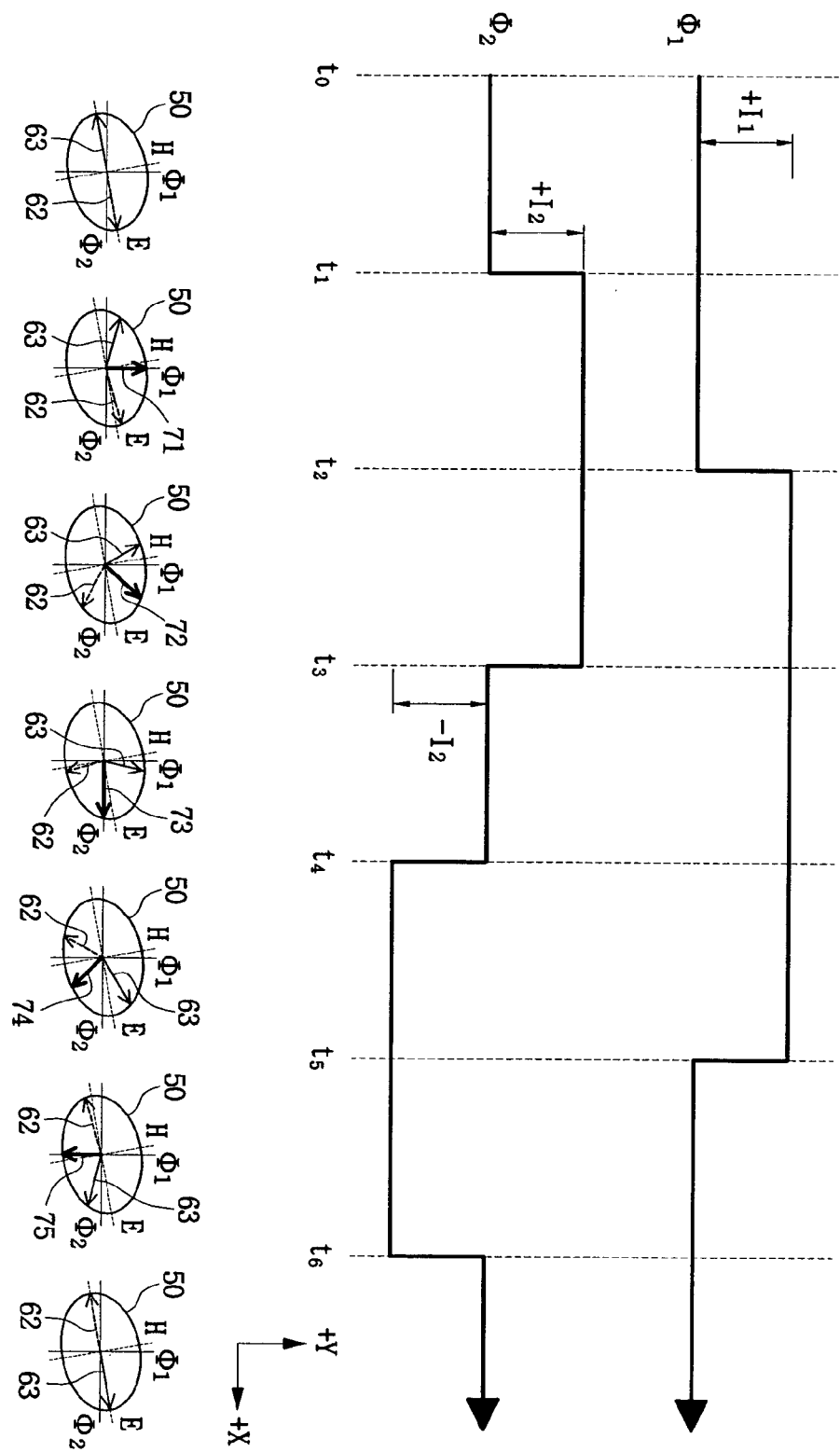

Referring to FIG. 9, the process of changing the magnetization direction of the MTJ 50 into the low resistance state will be described when the MTJ 50 having the same configuration as that described with reference to FIG. 8 is disposed and the MTJ 50 is read to be in the high resistance state.

Referring to FIG. 9, when the MTJ 50 is read to be in the high resistance state, the magnetization directions 62 and 63 within the bottom free layer 44 and the top free layer 46 are aligned anti-parallel to each other, and the magnetization direction 62 within the bottom free layer 44 is aligned anti-parallel to the magnetization direction 61 which is kept within the pinned layer 37. In addition, the magnetization directions 62 and 63 within the bottom free layer 44 and the top free layer 46 are aligned along the magnetization easy axis E of the MTJ 50.

As described with reference to FIG. 8, when the first write line pulse Φ1 and the second write line pulse Φ2 are subjected to the process of changing the magnetization direction during the time from $t_1$ to $t_6$, the magnetization directions 62 and 63 within the bottom free layer 44 and the top free layer 46 are rotated by 180° from their initial states.

As a result, the MTJ 50 has a low resistance state changed from the high resistance state.

Figure 10:
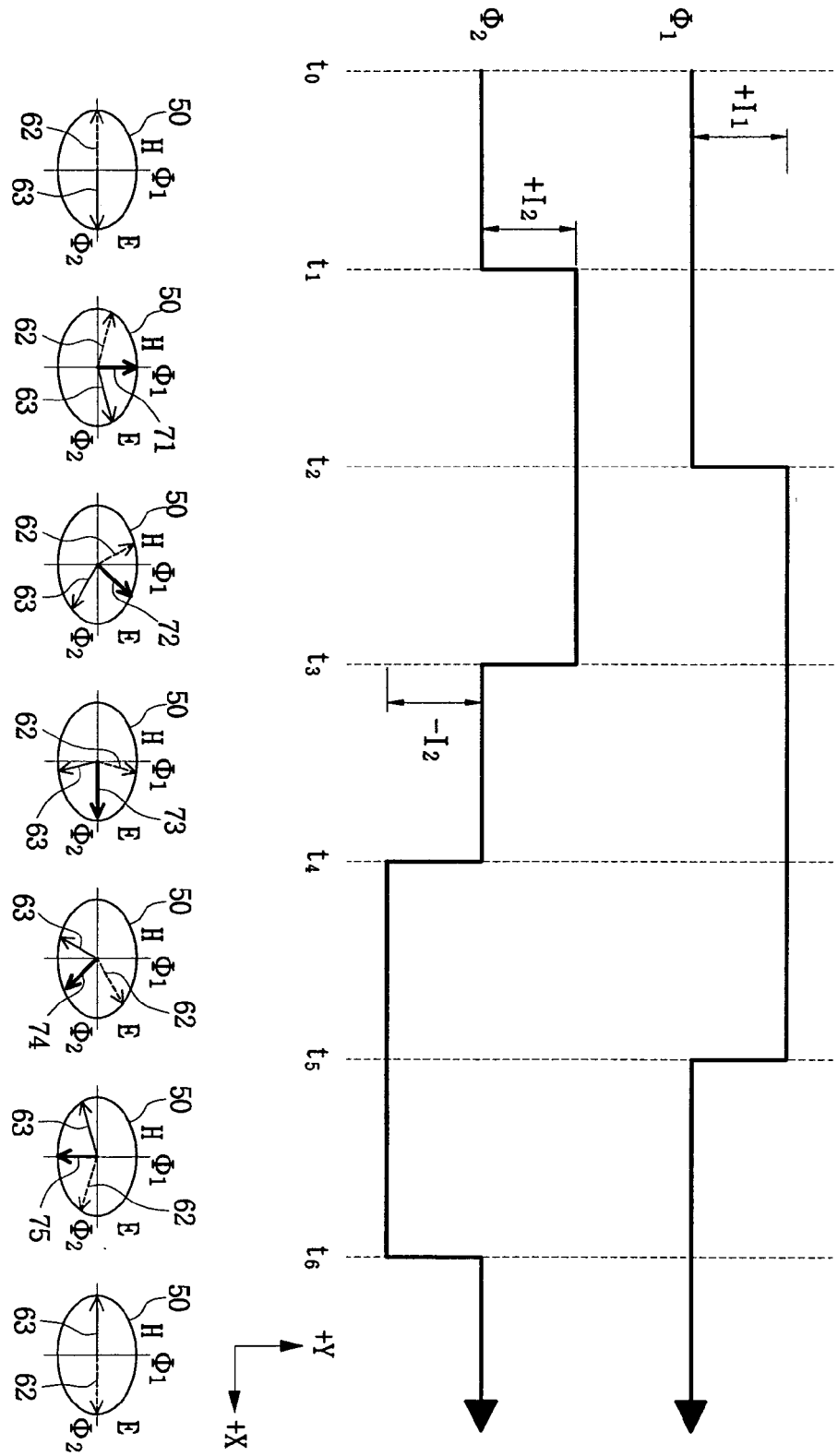

Referring to FIG. 10, the process of changing the magnetization direction of the MTJ 50 which employs the toggle switching method according to other embodiments of the present invention will be described. It is assumed that the geometric shape of the MTJ 50 is formed to be elliptic when seen from its plan view, and the magnetization easy axis E formed in the MTJ 50 is disposed parallel to the line to which the second write line pulse Φ2 is applied. In addition, the process of changing the magnetization direction of the MTJ 50 into the high resistance state will be described when the MTJ 50 is read to be in the low resistance state.

Referring to FIG. 10, when the MTJ 50 is read to be in the low resistance state, the magnetization directions 62 and 63 within the bottom free layer 44 and the top free layer 46 are aligned anti-parallel to each other, and the magnetization direction 62 within the bottom free layer 44 is aligned parallel to the magnetization direction 61 which is kept within the pinned layer 37. In addition, the magnetization directions 62 and 63 within the bottom free layer 44 and the top free layer 46 are aligned along the magnetization easy axis E of the MTJ 50. In this case, the magnetization easy axis E is formed parallel to the line to which the second write line pulse Φ2 is applied.

As described with reference to FIG. 8, when the first write line pulse Φ1 and the second write line pulse Φ2 are subjected to the process of changing the magnetization direction during the time from $t_1$ to $t_6$, the magnetization directions 62 and 63 within the bottom free layer 44 and the top free layer 46 are rotated by 180° from their initial states.

As a result, the MTJ 50 has a high resistance state changed from the low resistance state.

Figure 11:
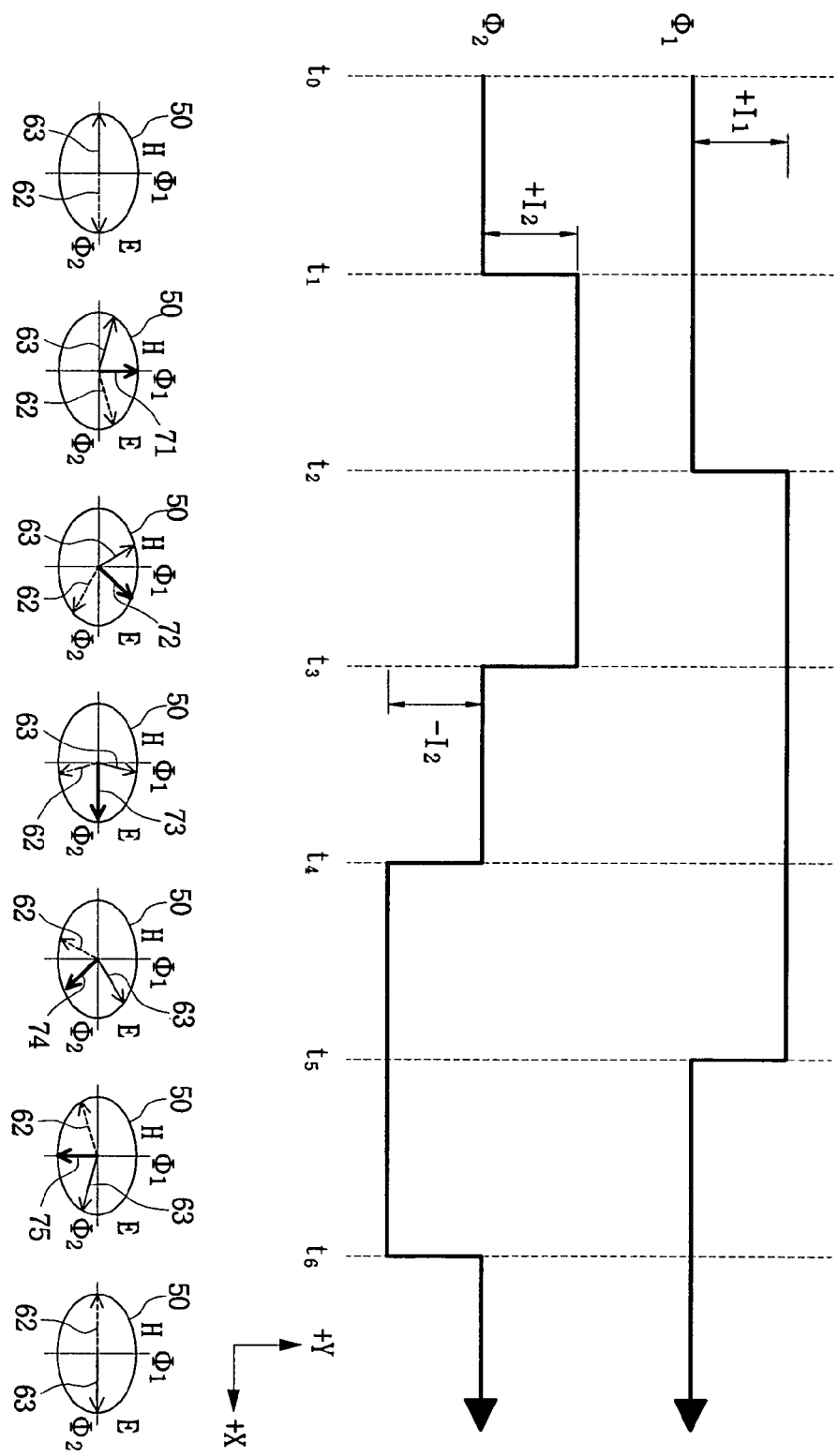

Referring to FIG. 11, the process of changing the magnetization direction of the MTJ 50 into the low resistance state will be described when the MTJ 50 having the same configuration as that described with reference to FIG. 10 is disposed and the MTJ 50 is read to be in the high resistance state.

Referring to FIG. 11, when the MTJ 50 is read to be in the high resistance state, the magnetization directions 62 and 63 within the bottom free layer 44 and the top free layer 46 are aligned anti-parallel to each other, and the magnetization direction 62 within the bottom free layer 44 is aligned anti-parallel to the magnetization direction 61 which is kept within the pinned layer 37. In addition, the magnetization directions 62 and 63 within the bottom free layer 44 and the top free layer 46 are aligned along the magnetization easy axis E of the MTJ 50. In this case, the magnetization easy axis E is formed parallel to the line to which the second write line pulse Φ2 is applied.

As described with reference to FIG. 10, when the first write line pulse Φ1 and the second write line pulse Φ2 are subjected to the process of changing the magnetization direction during the time from $t_1$ to $t_6$, the magnetization directions 62 and 63 within the bottom free layer 44 and the top free layer 46 are rotated by 180° from their initial states.

As a result, the MTJ 50 has a low resistance state changed from the high resistance state.

According to the embodiments of the present invention as described above, the MTJ 50 may be disposed at an angle equal to or greater than 0° and less than 90° to the line to which the second write line pulse Φ2 is applied. When the line to which the first write line pulse Φ1 is applied is the bit line BL and the line to which the second write line pulse Φ2 is applied is the digit line DL, the MTJ 50 may be disposed parallel to the digit line DL or at an angle greater than 0° and less than 90° to the digit line DL. For example, the magnetization easy axis of the MTJ 50 may be disposed parallel to the digit line DL, or may be disposed to have a plane intersection angle of 10°, 30°, 60°, or 80° to the digit line DL. In addition, when the line to which the first write line pulse Φ1 is applied is the digit line DL and the line to which the second write line pulse Φ2 is applied is the bit line BL, the MTJ 50 may be disposed parallel to the bit line BL or at an angle greater than 0° and less than 90° to the bit line BL.

According to the present invention as mentioned above, a first write line pulse is applied to one of a digit line and a bit line, and a second write line pulse is applied to the other of the digit line and the bit line so that the magnetization state of the MTJ is changed. A first positive current pulse of the first write line pulse is turned on at the time $t_2$ and then turned off at the time $t_5$, and a second positive current pulse is turned on at the time $t_1$ and then turned off at the time $t_3$ and a second negative current pulse is turned on at the time $t_4$ and then turned off at the time $t_6$ in the second write line pulse. Accordingly, the MTJ may be disposed at an angle equal to or greater than 0° and less than 90° to a line to which the second write line pulse is applied. That is, the magnetization state of the MTJ may be changed even when the MTJ is freely disposed at an angle equal to or greater than 0° and less than 90° to the line to which the second write line pulse is applied. Accordingly, an MRAM device suitable for high density may be implemented.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of writing to a magnetic random access memory (MRAM) device, comprising:
   preparing a digit line disposed on a semiconductor substrate, a bit line crossing over the digit line, and a magnetic tunnel junction (MTJ) interposed between the digit line and the bit line, the MTJ having a pinned layer, a tunneling insulating layer and a synthetic anti-ferromagnetic (SAF) free layer which are sequentially stacked, the SAF free layer having a bottom free layer and a top free layer which are separated by an exchange spacer layer; and
   applying a first write line pulse to one of the digit line and the bit line, in which a first positive current pulse is turned on at a time $t_2$ and turned off at a time $t_5$, and a second write line pulse, to the other of the digit line and the bit line, in which a second positive current pulse is turned on at a time $t_1$ and turned off at a time $t_3$, and a negative current pulse is turned on at a time $t_4$ and turned off at a time $t_6$.

2. The method as recited in claim 1, wherein the time has a relationship of $t_1 < t_2 < t_3 \leq t_4 < t_5 < t_6$.

3. The method as recited in claim 2, wherein the time $t_3$ is equal to the time $t_4$.

4. The method as recited in claim 1, further comprising:
   reading an initial magnetization state of the MTJ before applying the first and second write line pulses; and
   comparing the initial magnetization state with a desired magnetization state.

5. The method as recited in claim 4, wherein the magnetization state of the MTJ is changed to be opposite to the initial magnetization state at the time $t_6$.

6. The method as recited in claim 1, wherein the digit line and the bit line are orthogonal to each other.

7. The method as recited in claim 1, wherein the first write line pulse is applied to the digit line and the second write line pulse is applied to the bit line.

8. The method as recited in claim 1, wherein the first write line pulse is applied to the bit line and the second write line pulse is applied to the digit line.

9. The method as recited in claim 1, wherein the MTJ is disposed at an angle equal to or greater than 0° and less than 90° to the line to which the second write line pulse is applied.

10. The method as recited in claim 1, wherein the MTJ is disposed at an angle parallel to the digit line.

11. The method as recited in claim 1, wherein the MTJ is disposed at an angle parallel to the bit line.

12. The method as recited in claim 1, wherein the pinned layer, the bottom free layer, and the top free layer are ferromagnetic layers.

13. The method as recited in claim 12, wherein the ferromagnetic layers are formed of a material selected from a group consisting of Co, Fe, Ni, and an alloy composed of at least two materials selected from the group.

14. The method as recited in claim 1, wherein the exchange spacer layer is formed of one material selected from a group consisting of Ru, Rh, Ir, Cr, Cu, and Re.

15. A method of writing to a magnetic random access memory (MRAM) device, comprising:
preparing a digit line disposed on a semiconductor substrate, a bit line crossing over the digit line, and a magnetic tunnel junction (MTJ) interposed between the digit line and the bit line, the MTJ having a pinned layer, a tunneling insulating layer and a synthetic anti-ferromagnetic (SAF) free layer and which are sequentially stacked, the SAF free layer having a bottom free layer and a top free layer which are separated by an exchange spacer layer;
reading an initial magnetization state of the MTJ;
comparing the initial magnetization state with a desired magnetization state; and
when the initial magnetization state is different from the desired magnetization state, applying a first write line pulse to one of the digit line and the bit line, in which a first positive current pulse is turned on at a time $t_2$ and turned off at a time $t_5$, and a second write line pulse to the other of the digit line and the bit line, in which a second positive current pulse is turned on at a time $t_1$ and turned off at a time $t_3$, and a negative current pulse is turned on at a time $t_4$ and turned off at a time $t_6$.

16. The method as recited in claim 15, wherein the time has a relationship of $t_1<t_2<t_3 \leq t_4<t_5<t_6$.

17. The method as recited in claim 16, wherein the time $t_3$ is equal to the time $t_4$.

18. The method as recited in claim 16, wherein the MTJ is freely disposed at an angle equal to or greater than 0° and less than 90° to a line to which the second write line pulse is applied.

19. The method as recited in claim 15, wherein the MTJ is disposed at an angle parallel to the digit line.

20. The method as recited in claim 15, wherein the MTJ is disposed at an angle parallel to the bit line.

* * * * *